United States Patent
Nayfeh et al.

(10) Patent No.: US 8,976,336 B2
(45) Date of Patent: Mar. 10, 2015

(54) SHEAR-LAYER CHUCK FOR LITHOGRAPHIC APPARATUS

(71) Applicant: ASML Holding N.V., Veldhoven (NL)

(72) Inventors: Samir A. Nayfeh, Shrewsbury, MA (US); Mark Edd Williams, Amherst, NH (US); Justin Matthew Verdirame, Cambridge, MA (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 14/259,723

(22) Filed: Apr. 23, 2014

(65) Prior Publication Data

US 2014/0233009 A1 Aug. 21, 2014

Related U.S. Application Data

(62) Division of application No. 13/938,746, filed on Jul. 10, 2013, now Pat. No. 8,786,832, which is a division of application No. 12/921,556, filed as application No. PCT/EP2009/002577 on Apr. 7, 2009, now abandoned.

(60) Provisional application No. 61/071,059, filed on Apr. 10, 2008.

(51) Int. Cl.
*G03F 7/20* (2006.01)
*H01L 21/687* (2006.01)
*H01L 21/683* (2006.01)

(52) U.S. Cl.
CPC ........ *G03F 7/70716* (2013.01); *G03F 7/70783* (2013.01); *G03F 7/707* (2013.01); *H01L 21/68714* (2013.01); *H01L 21/6875* (2013.01); *H01L 21/683* (2013.01); *Y10S 414/141* (2013.01)
USPC .............. 355/72; 269/21; 269/55; 310/12.05; 310/12.06; 355/53; 355/75; 414/941

(58) Field of Classification Search
CPC . G03F 7/707; G03F 7/70716; G03F 7/70783; H01L 21/683–21/6833; H01L 21/6838; H01L 21/687; H01L 21/68714; H01L 21/6875; Y10S 414/141

USPC .......... 269/21, 55, 56; 278/3, 128; 310/12.05, 310/12.06; 355/53, 72, 75, 77; 362/234; 414/941
See application file for complete search history.

(56) References Cited

U.S. PATENT DOCUMENTS 5,101,301 A * 3/1992 Iwase et al. .................. 359/872
7,009,683 B2 3/2006 Sato (Continued)

FOREIGN PATENT DOCUMENTS

EP 1 434 100 A2 6/2004
JP 2002-134599 A 5/2002

(Continued)

OTHER PUBLICATIONS

International Searcg Report directed to related International Patent Application No. PCT/EP2009/002577, mailed Jun. 26, 2009; 5 pages.

(Continued)

*Primary Examiner* — Colin Kreutzer
(74) *Attorney, Agent, or Firm* — Sterne, Kessler, Goldstein & Fox P.L.L.C.

(57) ABSTRACT

A lithographic apparatus is described that comprises a support structure to hold an object. The object may be a patterning device or a substrate to be exposed. The support structure comprises a chuck, on which the object is supported, and an array of shear-compliant elongated elements normal to the chuck and the stage, such that first ends of the elongated elements contact a surface of the chuck and second ends of the elongated elements contact a stage. Through using the array of elongated elements, a transfer of stress between the stage and the chuck is substantially uniform, resulting in minimization of slippage of the object relative to the surface of the chuck during a deformation of the chuck due to the stress.

12 Claims, 13 Drawing Sheets

(56) References Cited

U.S. PATENT DOCUMENTS

| | | |
|---|---|---|
| 7,268,476 B2 | 9/2007 | Ichihara et al. |
| 8,786,832 B2 | 7/2014 | Nayfeh et al. |
| 2002/0037460 A1 | 3/2002 | Takahashi |
| 2002/0117792 A1 | 8/2002 | Leidy et al. |
| 2004/0067420 A1 | 4/2004 | Ota |
| 2005/0140962 A1 | 6/2005 | Ottens et al. |
| 2005/0200827 A1 | 9/2005 | Tanaka |
| 2006/0285093 A1 | 12/2006 | Hara et al. |
| 2006/0290915 A1 | 12/2006 | Bijvoet |
| 2007/0103666 A1* | 5/2007 | Ottens et al. ............ 355/72 |
| 2007/0165357 A1 | 7/2007 | Kochersperger |
| 2007/0258081 A1 | 11/2007 | Baggen et al. |
| 2007/0268476 A1 | 11/2007 | Phillips et al. |
| 2008/0111984 A1 | 5/2008 | Shibuta |
| 2008/0117551 A1 | 5/2008 | Brackley et al. |
| 2011/0013164 A1 | 1/2011 | Nayfeh et al. |
| 2014/0016110 A1 | 1/2014 | Nayfeh et al. |

FOREIGN PATENT DOCUMENTS

| | | |
|---|---|---|
| JP | 2003-007602 A | 1/2003 |
| JP | 2003-197725 A | 7/2003 |
| JP | 2003-332411 A | 11/2003 |
| JP | 2004-319891 A | 11/2004 |
| JP | 2007-005362 A | 1/2007 |
| WO | WO 2007/136123 A1 | 11/2007 |

OTHER PUBLICATIONS

Preliminary Report on Patentability and Written Opinion of the International Searching Authority directed to related International Patent Application No. PCT/EP2009/002577, mailed Oct. 12, 2010, from the International Bureau of WIPO; 7 pages.

Non-Final Rejection mailed Feb. 27, 2013 for U.S. Appl. No. 12/921,556, filed Sep. 8, 2010; 10 pages.

Final Rejection mailed Jun. 10, 2013 for U.S. Appl. No. 12/921,556, filed Sep. 8, 2010; 10 pages.

Notice of Allowance mailed Mar. 14, 2014 for U.S. Appl. No. 13/938,746, filed Jul. 10, 2013; 12 pages.

* cited by examiner

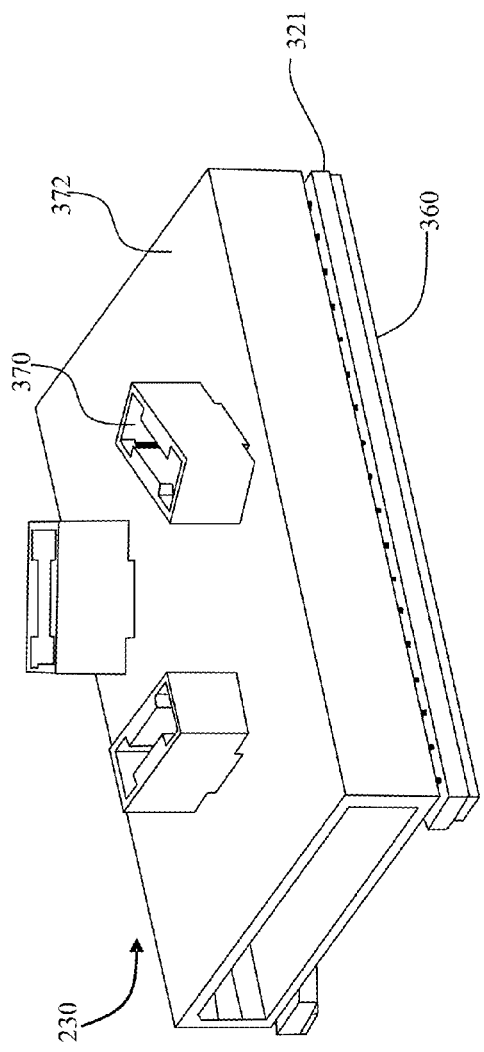
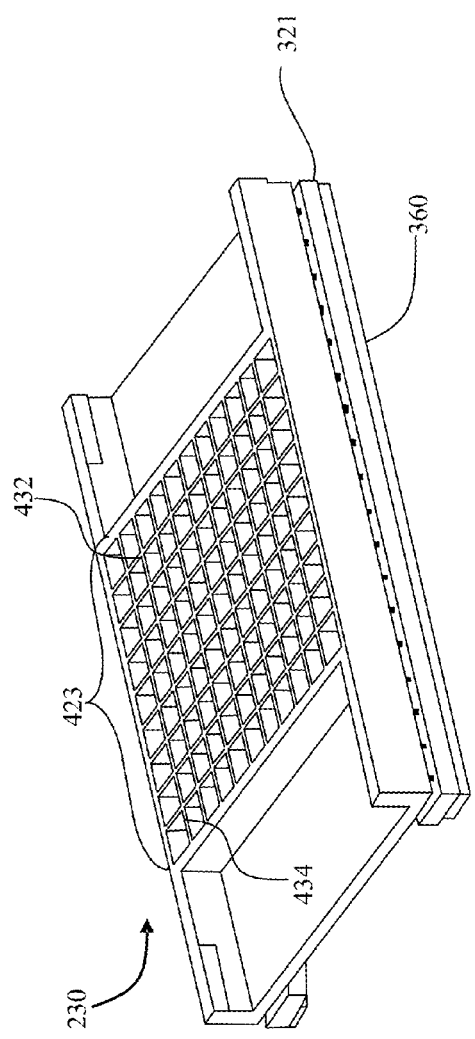

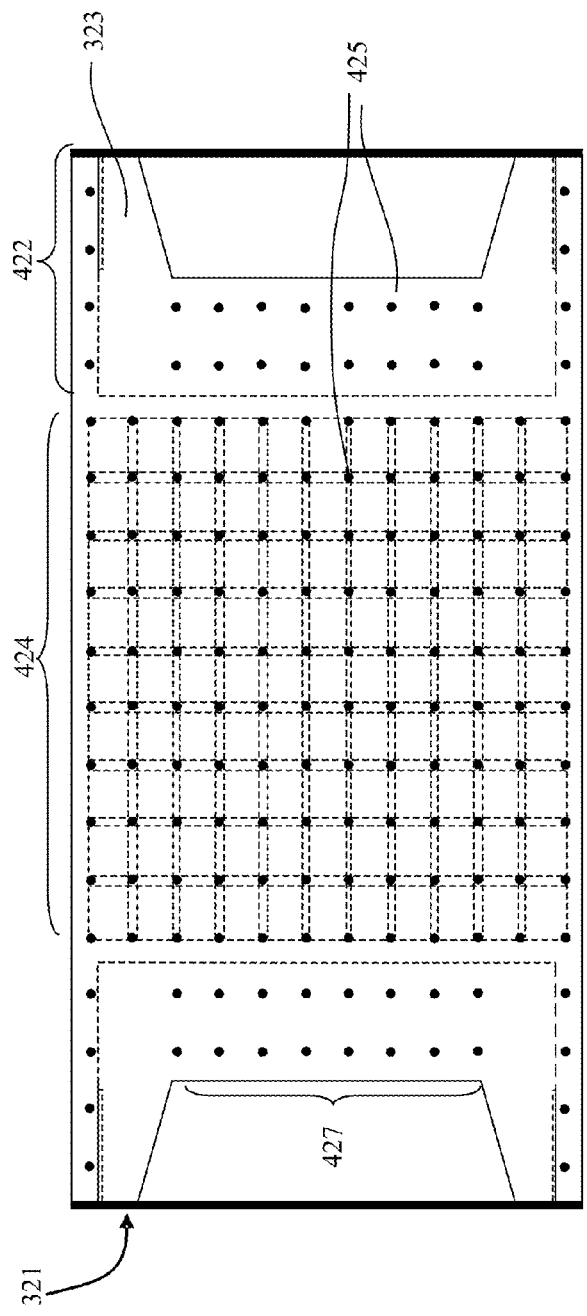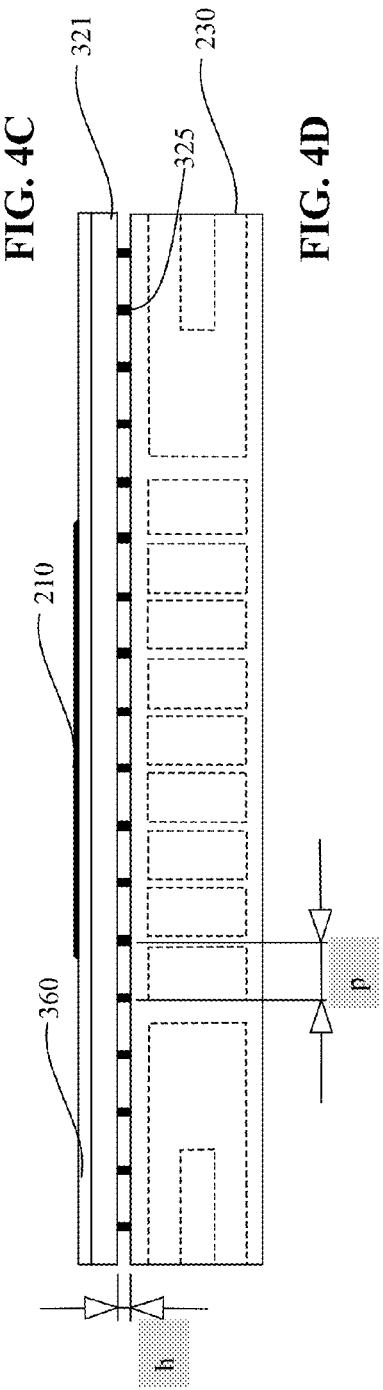
FIG. 4C
FIG. 4D

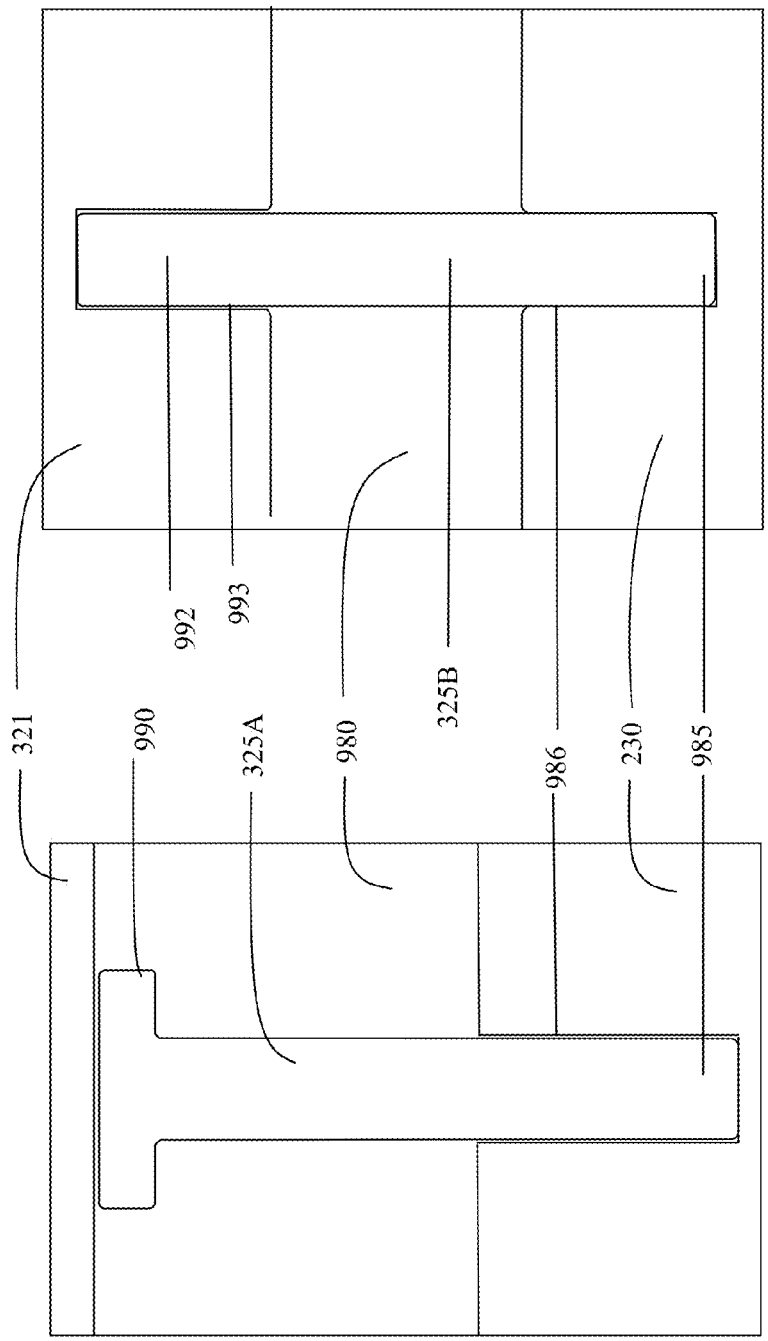

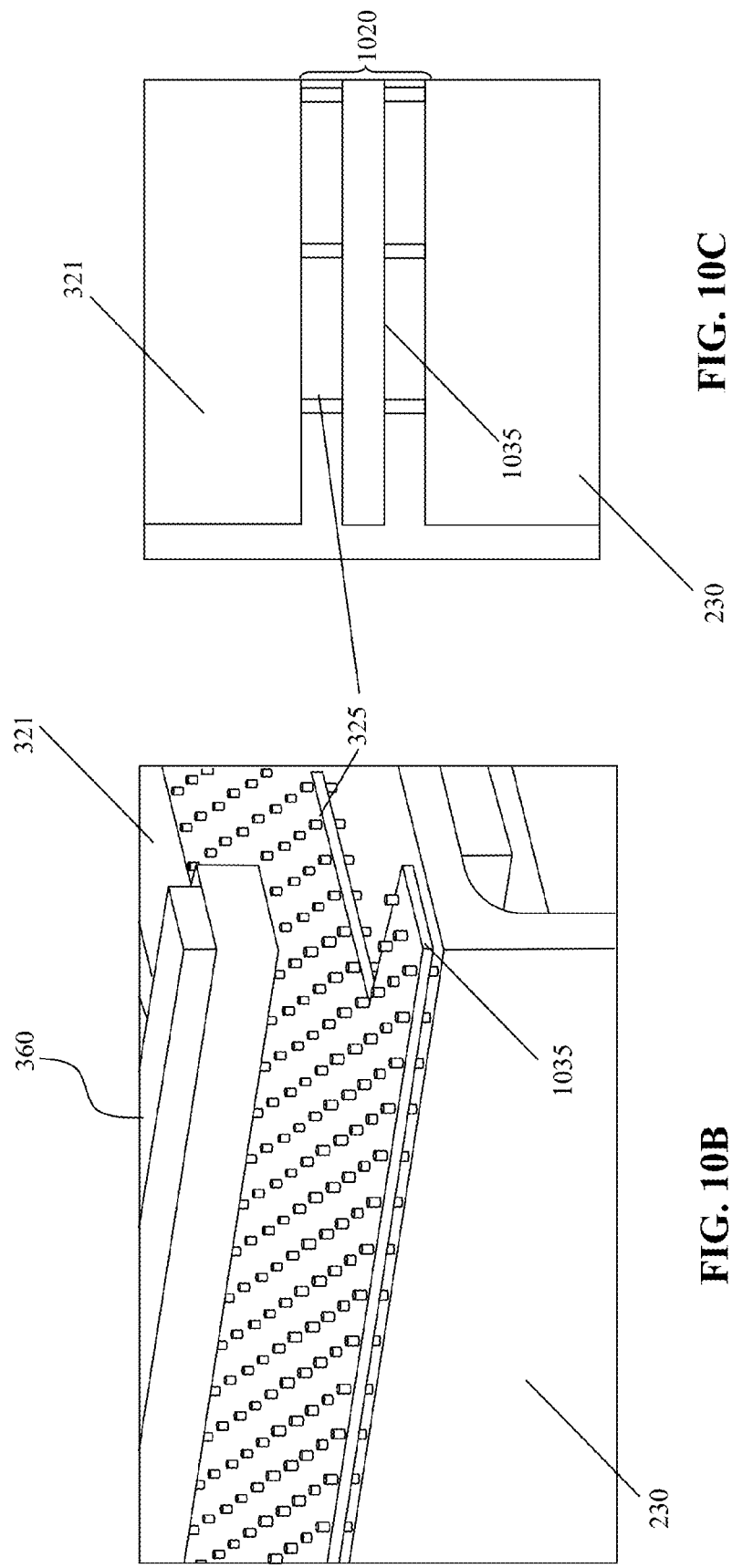

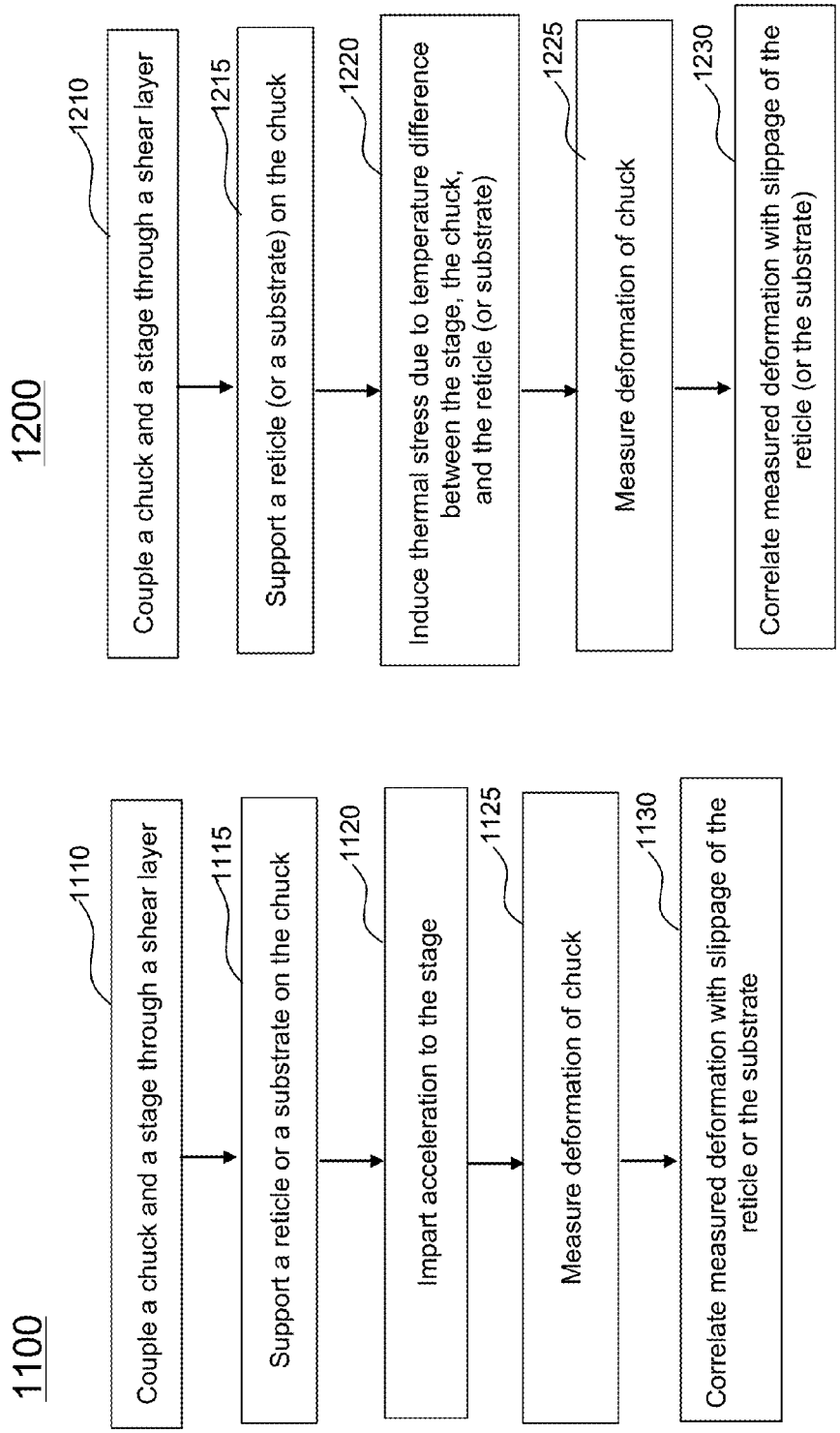

SHEAR-LAYER CHUCK FOR LITHOGRAPHIC APPARATUS

BACKGROUND

1. Field of the Invention

The present invention relates to a lithographic apparatus and method of securely holding an object in the lithographic apparatus.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging the pattern using a UV radiation beam onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Conventionally, a clamping device is used to securely hold an object, such as, a reticle or a substrate, to a supporting base structure, referred to as a "stage." The "stage" is alternatively referred to as a "table," a "frame," or a "force frame." The clamp can be referred to as a "chuck." A stage may be coupled to a chuck by a variety of means, including kinematic supports at three points. A chuck may also be constructed integral to the stage. During movement of the stage, or during an exposure operation, the object is typically securingly coupled to the chuck using a normal force (i.e., a force acting perpendicular to the chuck) generated by electrostatic attraction or a partial vacuum between the object and the chuck. The normal force and a normal stiffness of the chuck serve to secure the object in a normal direction during the movement or exposure. In a tangential direction, i.e., in a plane of the chuck, the object is prevented from moving relative to the chuck during movement or exposure through friction between the chuck and the object.

When acceleration is imparted to the stage during exposure or pre-exposure alignment, a stress is transferred from the stage to the chuck, and this stress may cause the chuck as well as the object to deform. Typically the transfer of acceleration-induced stress from the stage to the chuck (as well as from the chuck to the object) is not uniform. This gives rise to a potential for slip between the chuck and the object, especially in cases where the chuck deformation is large. Chuck deformation may also be caused by temperature differences between the stage, the chuck, and/or the object, resulting in slippage of the object relative to the chuck.

A conventional approach to limit the transfer of stress between the chuck and the stage is to use precision-machined kinematic or semi-kinematic mounts to isolate the chuck from the stage. However, kinematic mounts at a number of discrete locations may not uniformly distribute the transfer of stress. An alternative approach to distribute the transfer of stress more uniformly is to use a chuck comprising a plurality of burls that make local contacts with the supported object.

FIG. 2A depicts a conventional chuck 200 comprising a plurality of burls 225. A stage 230 holds an object 210, e.g., by electrostatic force applied through a planar electrode 220 in a normal direction. Object 210 has a top surface 212 and a bottom surface 214, which is opposite top surface 212. Burls 225 support object 210. Each of the burls 225 acts like a spring, shown symbolically as spring 205, providing a predetermined amount of shear compliance.

FIG. 2B is a bottom view showing bottom surface 214 of object 210. Top ends of burls 225 form local contacts 227 at bottom surface 214 of object 210.

Dimension and arrangement of burls 225 may be tailored to some extent to provide shear compliance. However, materials used in burls 225 have many additional requirements, including but not limited to, hardness, machineability, coefficient of thermal expansion, etc. Thus, it may be difficult to tailor burls 225 for a desired shear compliance in all directions of interest. For example, while it is desirable to have a high shear compliance at an interface of object 210 and burls 225, it is also desirable to have a low normal compliance at the interface. Burls 225 that directly contact object 210 typically have high compliance in normal direction as well, making it harder to optimize the overall shear compliance of the system. Moreover, burls 225 with the desired shear compliance are typically long and slender, and their shape makes electrostatic clamping of the object quite challenging. Additionally, planarity of object 210 may be compromised due to non-uniform stress distribution in burls 225.

SUMMARY

It is desirable to design a chuck that provides a desired shear compliance to minimize slippage of a supported object under a condition of stress, but does not suffer from the limitations described above.

According to a first embodiment of the present invention, a system comprises a chuck and an array of elongated elements having first and second respective ends, such that the first ends contact the chuck and the second ends contact a stage. Through using the array of elongated elements, a transfer of stress between the stage and the chuck is rendered substantially uniform, resulting in minimization of slippage of an object relative to the first surface of the chuck during a movement of the chuck relative to the stage.

According to another embodiment, a method comprises coupling an array of elongated elements between a chuck and a stage, such that longitudinal axes of the elongated elements are normal to the chuck and the stage, and first ends of the elongated elements contact a second surface of the chuck, and second ends of the elongated elements contact the stage. Under a condition of stress, a transfer of the stress between the stage and the chuck is rendered substantially uniform through using the array of elongated elements. The method further comprises supporting an object on a first surface of the chuck, the first surface being opposite the second surface. The method also comprises subjecting the chuck and the stage to the condition of stress, and measuring deformations of the chuck and the stage under the condition of stress to correlate the measured deformations with slippage of the object relative to the first surface of the chuck.

According to a further embodiment, a lithographic apparatus comprises an illumination system configured to produce a beam of radiation, a patterning device configured to pattern the beam of radiation, a projection system configured to project the patterned beam of radiation onto a substrate, and a support system. The support system comprises a chuck having a first surface and a second surface, and an array of elongated elements having first and second respective ends and having longitudinal axes, the longitudinal axes being normal to the second surface of the chuck, such that the first ends contact the second surface of the chuck and the second ends contact a stage. Through using the array of elongated elements, a transfer of stress between the stage and the chuck is substantially uniform, resulting in minimization of slippage of an object relative to the first surface of the chuck during a deformation of the chuck due to the stress. The pattering device or the substrate is configured to be the object mounted on the chuck.

According to yet another embodiment, a system supporting an object comprises a chuck having a first surface that supports the object; a stage that supports the chuck in one or more directions of translation or rotation; and an interface layer between the chuck and the stage with a relatively low stiffness in at least one direction of translation or rotation with respect to the other directions of translation or rotation, resulting in minimization of slippage of the object relative to the first surface of the chuck during deformation of the chuck due to a stress between the stage and the chuck.

According to yet another embodiment, a system comprises a chuck having a first surface and a second surface, which is located opposite the first surface, wherein the chuck is configured to hold an object; and an array of elongated elements having first and second respective ends and having longitudinal axes normal to the second surface of the chuck, wherein the first ends contact the second surface of the chuck and the second ends contact a stage to isolate the chuck from the stage by rigidly coupling the chuck to the stage such that the array of elongated elements uniformly distribute stress therebetween.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 4A and 4B schematically show details of the support structure shown in FIG. 3, according to an embodiment of the present invention.

FIGS. 4C and 4D schematically show top and side views of detailed pin layouts of an example chuck with a shear layer, according to an embodiment of the present invention.

FIGS. 9A and 9B schematically show two different configurations of the elongated elements of the shear layer of FIG. 3, according to two embodiments of the present invention.

FIGS. 10A-10C schematically show different views of an embodiment of the present invention where an interface membrane layer is used in between the chuck and the stage.

FIGS. 11 and 12 schematically show flowcharts describing example processes, according to various embodiments of the present invention.

Figure 1:
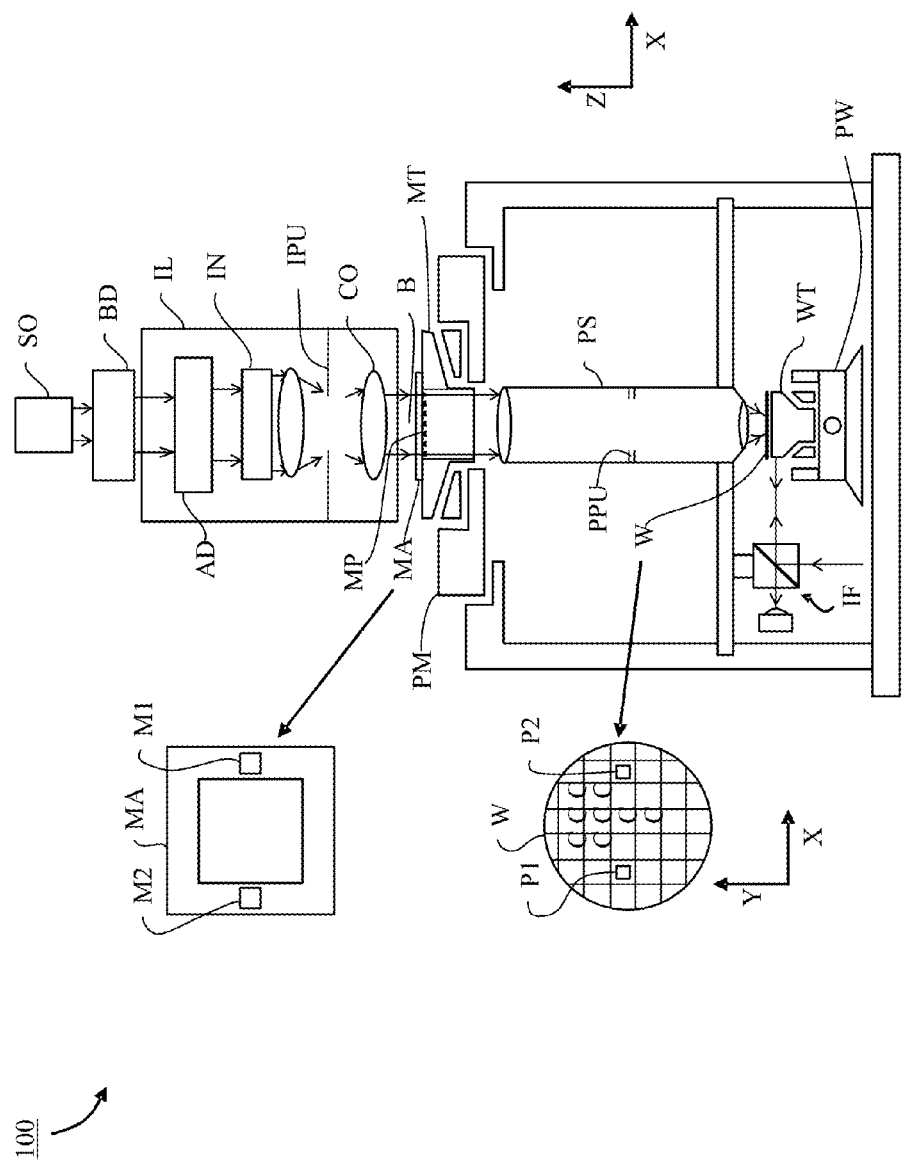
FIG. 1 schematically depicts a reticle-based lithographic apparatus, according to an embodiment of the present invention.
Figures 2A, 2B:
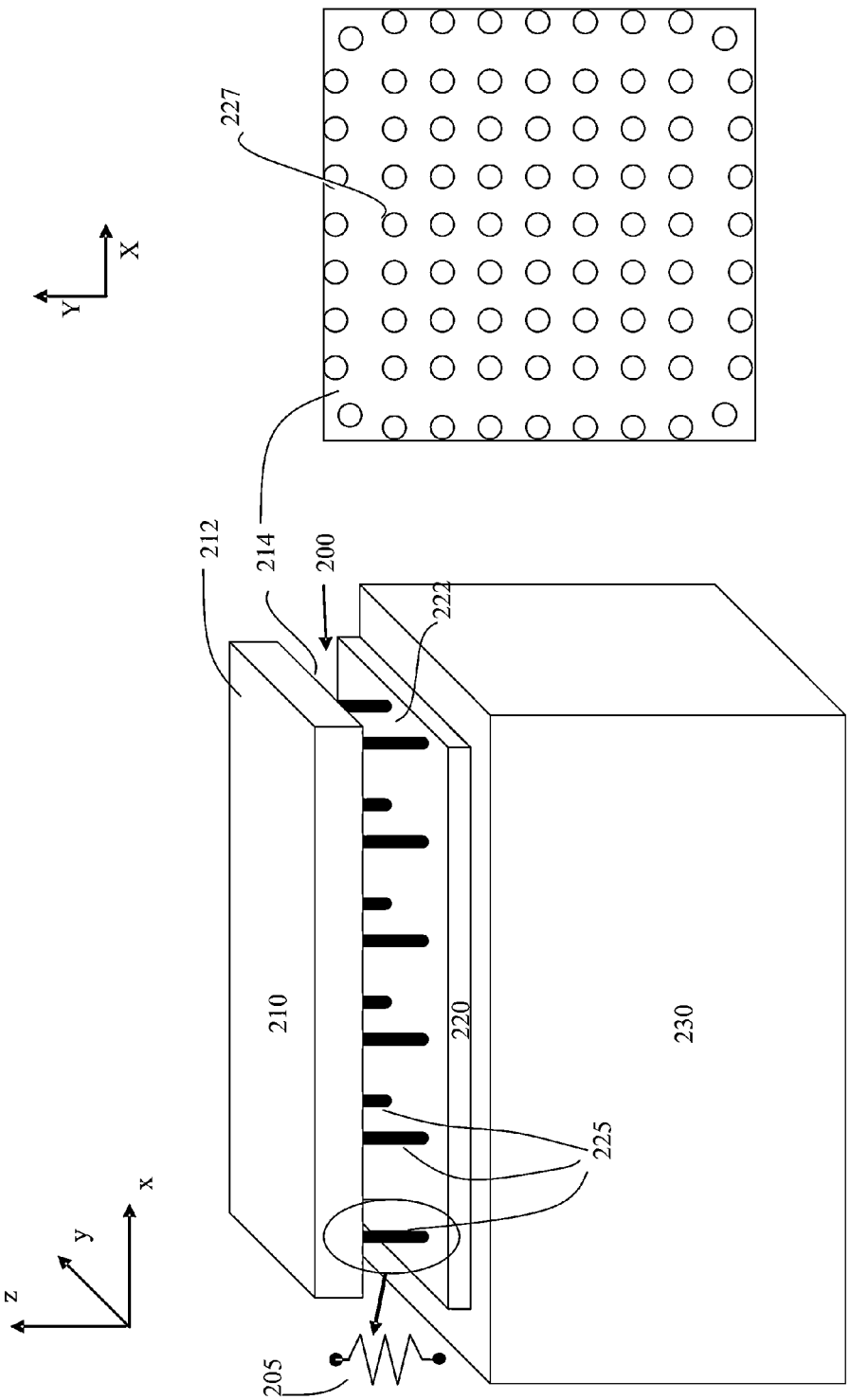
FIGS. 2A and 2B schematically depict a chuck in a lithographic apparatus comprising a plurality of burls supporting an object.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described. Additionally, terms indicating physical orientation, such as "top", "bottom", "side" etc. are used for illustrative purposes only, and do not limit the invention to any particular orientation.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Lithographic Apparatus

FIG. 1 schematically depicts an embodiment of lithographic apparatus 100 suitable for use with one or more embodiments of the present invention. The apparatus comprises an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e., bears the weight of, the patterning device MA. It holds the patterning device MA in a manner that depends on the orientation of the patterning device MA, the design of the lithographic apparatus 100, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus 100 may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus 100 may be separate entities, for example when the source SO is an excimer laser. In such cases, the source SO is not considered to form part of the lithographic apparatus 100 and the radiation beam B is passed from the source SO to the illuminator IL with the aid of a beam delivery system BD comprising, for example, suitable directing mirrors and/or a beam expander. In other cases, the source SO may be an integral part of the lithographic apparatus 100, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation (5 nm or above).

The term "lens," where the context allows, may refer to any one or combination of various types of optical components, including refractive and reflective optical components.

Example Embodiment of Object Support Structure

Figure 3:
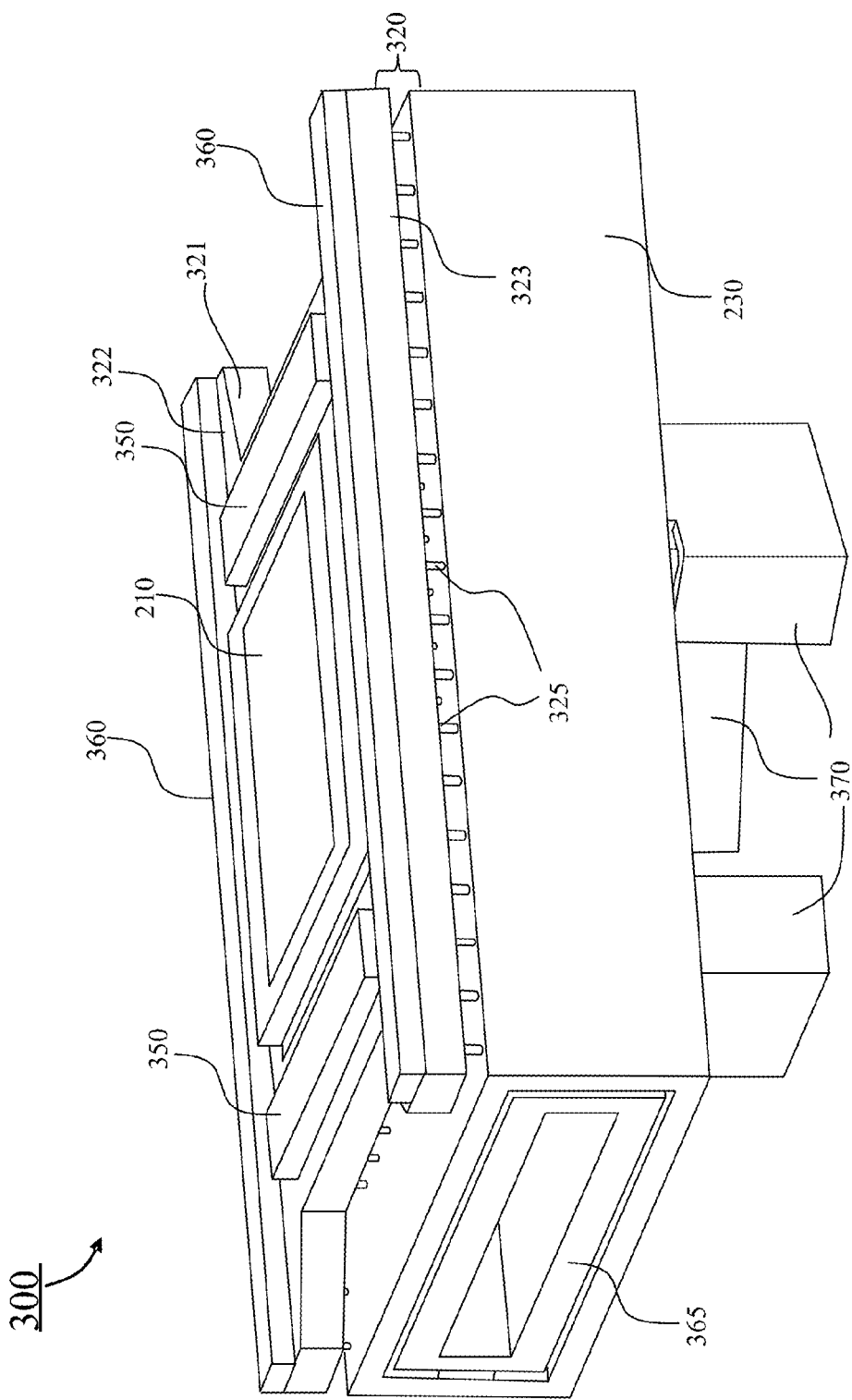
FIG. 3 schematically depicts a support structure with a chuck coupled to a stage through a shear layer comprising elongated elements, according to an embodiment of the present invention.

FIG. 3 shows an example support structure 300 for an object 210, according to an embodiment of the present invention. Support structure 300 comprises an interface layer referred to as a shear-compliant stress layer 320 (also referred to as the "shear-layer") coupling a chuck 321 and a stage 230. Object 210 is mounted on a first surface 322 of chuck 321. As mentioned above, object 210 may be a patterning device or a substrate.

In various examples, stage 230 may be made of a variety of materials, including, but not limited to, silicon-silicon carbide (SiSiC), Invar, stainless steel, aluminum oxide, Zerodur® (a glass-ceramic composite by Schott Glass Technologies), etc. In one example, stage 230 may be kinematically supported by a plurality of kinematic mounts (not shown). A similar configuration may also be used when various bearing arrangements, e.g., an air bearing, are used for supporting of stage 230. In the example embodiment shown in FIG. 3, stage 230 is driven magnetically in the XY plane. In this example, a yoke 365 is housed within stage 230. Yoke 365 may be comprise or any other suitable material. In this example, z-direction magnetic actuators 370 are used to magnetically levitate stage 230, so that stage 230 can be driven in the XY plane.

In one example, chuck 321 is designed with high flatness, so that object 210 is mounted with requisite flatness on first surface 322 of chuck 321. For example, chuck 321 may be made from a material with a relatively low coefficient of thermal expansion, such as Zerodur®. However, the present invention is not limited to a Zerodur® chuck, and other materials may be used. Desirable properties of the chuck material include chemical stability, structural homogeneity, good machineability, etc.

In one example, shear-layer 320 may comprise an array of elongated elements 325 (also referred to as "pins"), whose first ends are coupled to a second surface 323 of chuck 321, second surface 323 being opposite first surface 322 on which object 210 is mounted. Elongated elements 325 may be evenly spaced. Elongated elements 325 may not make direct contact with object 210, i.e., an interface between elongated elements 325 and chuck 321 is some distance away from the interface between chuck 321 and object 210. In this configuration, it is easier to tailor the shear-compliance of the elongated elements 325, because the normal compliance of elongated elements 325 becomes less of a design issue. Incorporation of shear-layer 320 enables achieving a relatively low stiffness in at least one direction of translation or rotation with respect to the other directions of translation or rotation of chuck 321. Elongated elements 325 may comprise materials including, but not limited to, Invar, SiSiC, stainless steel, etc, depending on the desired functionalities of shear-layer 320. In one example, a primary functionality of shear-layer 320 may be to distribute stress uniformly. Dimension and spatial arrangement of elongated elements 325 may be chosen so that under a condition of stress, a transfer of stress between stage 230 and chuck 321 is uniform. This may be done, for example, because a uniform transfer of stress minimizes the possibility of slippage of object 210 during deformation of chuck 321.

In one example, support structure 300 allows for combining disparate materials in a single construction that is easy to manufacture, but provides for a flexible design. The structure may allow for simultaneous reduction of mass and improvement of stiffness in the normal direction. One example embodiment using disparate materials comprises using Zerodur® for chuck 321, Invar for pins 325, and SiSiC for stage 230. Another example embodiment eliminates using Invar for pins 325, and comprises using form-compliant pins or elongated burls integrated with stage 230 made of SiSiC or other materials, as appropriate. Yet another embodiment comprises chuck 321, stage 230, and shear-layer 320 being made of a same material, e.g. Invar, Zerodur®, etc.

Additionally, or alternatively, one or more additional objects 350 and/or 360 may be supported by chuck 321. For example, object 350 and/or 360 may be positional sensors, that are used for determining a desired position and/or alignment of object 210. Positional sensors 350 and/or 360 may measure displacement or slippage of object 210 in the xy plane under a condition of stress with respect to a reference position. The reference position may be denoted by fixed coordinates or the initial position of object 210 prior to the condition of stress. Additional objects 350 and/or 360 may also be fiducial marks that facilitate initial positioning and/or alignment of object 210. They may also assist in measuring a relative displacement of object 210, and adjusting the position and alignment of object 210.

FIG. 4A shows an upside-down view of support structure 300, showing z-direction magnetic actuators 370 coupled to a bottom surface 372 of stage 230.

FIG. 4B shows a cut-out view of the inner structure of stage 230, according to one embodiment of the present invention. In this embodiment, stage 230 may not be constructed as a solid block in order to reduce mass and accommodate other structures. A central region 423 of stage 230 may comprise intersecting baffles 434 and 432 that cross each other in x and y directions, respectively. This type of structure provides adequate structural strength and stiffness for stage 230, while keeping the overall mass low.

FIG. 4C illustrates an example arrangement of elongated elements 325 (i.e., an example pin layout) on a bottom surface 323 of the chuck 321. Contact areas of the elongated elements 325 on the bottom surface 323 of the chuck 321 are denoted as 425. The chuck 321 has a central region 424 that is aligned and coupled to the central region 423 (shown in FIG. 4B) of the stage 230 through the elongated elements 325. Although not specifically shown in FIG. 4C, object 210 may be mounted above central region 424. Extension regions 422 and 427 outside central region 424 may also comprise contact areas 425.

FIG. 4D illustrates a side view of chuck 321 coupled to stage 230, and corresponds to the top view shown in FIG. 4C. In an example embodiment, a height 'h' of the elongated elements 325 may be about 6 mm, and a pitch 'p' of elongated elements 325 may be about 20 mm. Each elongated element may have about a 2 mm diameter. Other dimensional values may be used in alternative designs, as the invention is not limited to any particular dimensional values, or any particular arrangement of elongated elements 325.

Acceleration-Induced and Thermally-Induced Stress Simulation

FIGS. 5-8 illustrate results of computer simulations that have been performed to predict expected deformation of chuck 321, stage 230, and elongated elements 325 (shown in FIG. 3) under expected conditions of stress. In one example, Computer Aided Design (CAD) software, e.g., Solidworks (by Solidworks Corp. of Concord, Mass.) can be used to construct the schematic geometric figures to perform simulations. To perform the actual simulations under conditions of stress, a design analysis software, e.g., ANSYS® (by ANSYS, Inc. of Canonsburg, Pa.) may be used.

Figure 5:
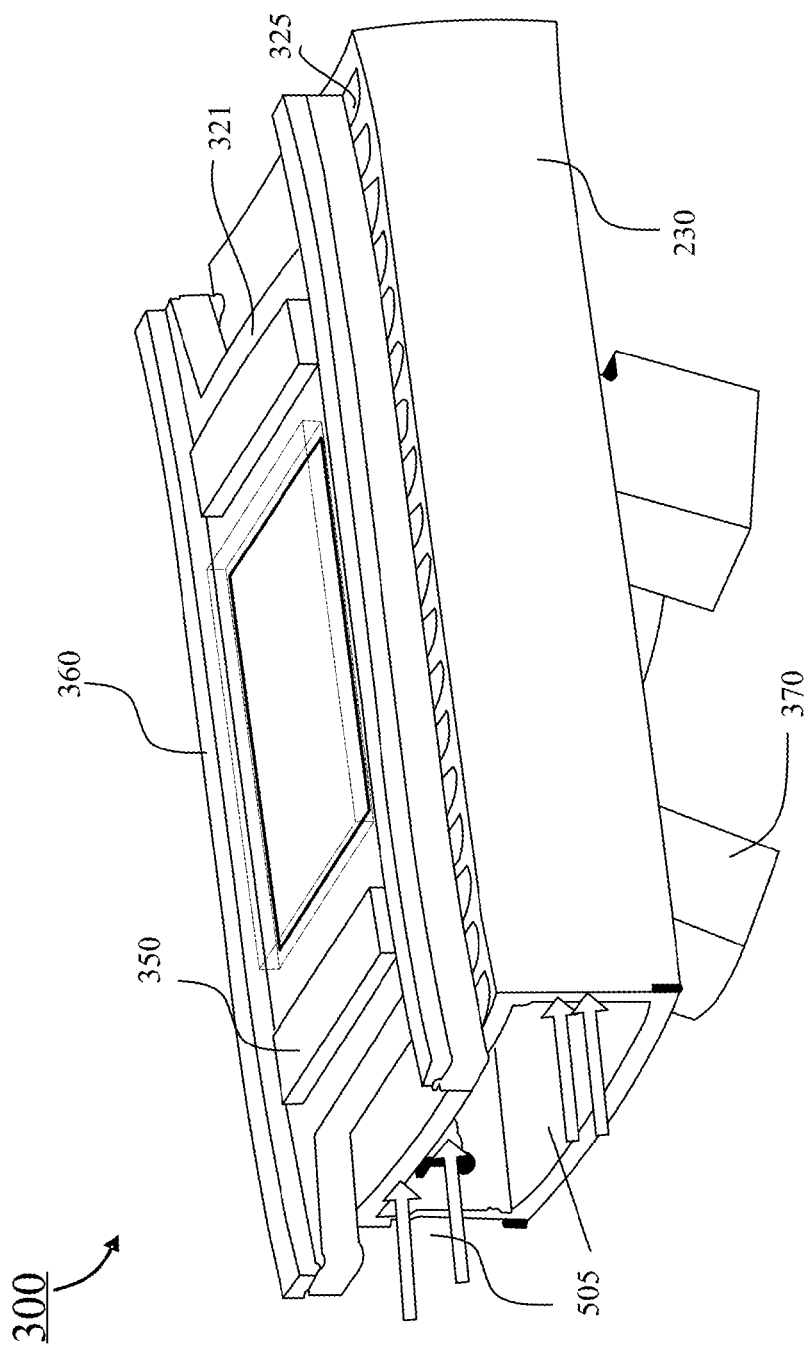
FIG. 5 schematically depicts a deformation of the chuck, the elongated elements, and the stage of FIG. 3, when an acceleration force is imparted on the stage, according to an embodiment of the present invention.

In particular, FIG. 5 depicts deformations of components of support structure 300 when an acceleration force 505 is imparted to stage 230. In FIG. 5, a scale of the deformation is magnified to more easily illustrate the nature of deformation of different components of support structure 300. According to an example simulation, deformation of chuck 321 beneath object 210 is as low as about 1.5 nm when an acceleration force of about 10 g is imparted to stage 230, deforming stage 230 by about 10-20 nm. An exemplary shear stiffness value of about 30 N/um is exhibited by elongated elements 325, which are assumed to be about 6 mm tall and about 2 mm in diameter. In this example, chuck 321 is deformed in a range of about 1-2 nm for acceleration as high as about 100 m/sec$^2$. Compared to that, a conventional baseline support structure construction may experience chuck deformation values as high as 27 nm under similar acceleration.

Figure 6:
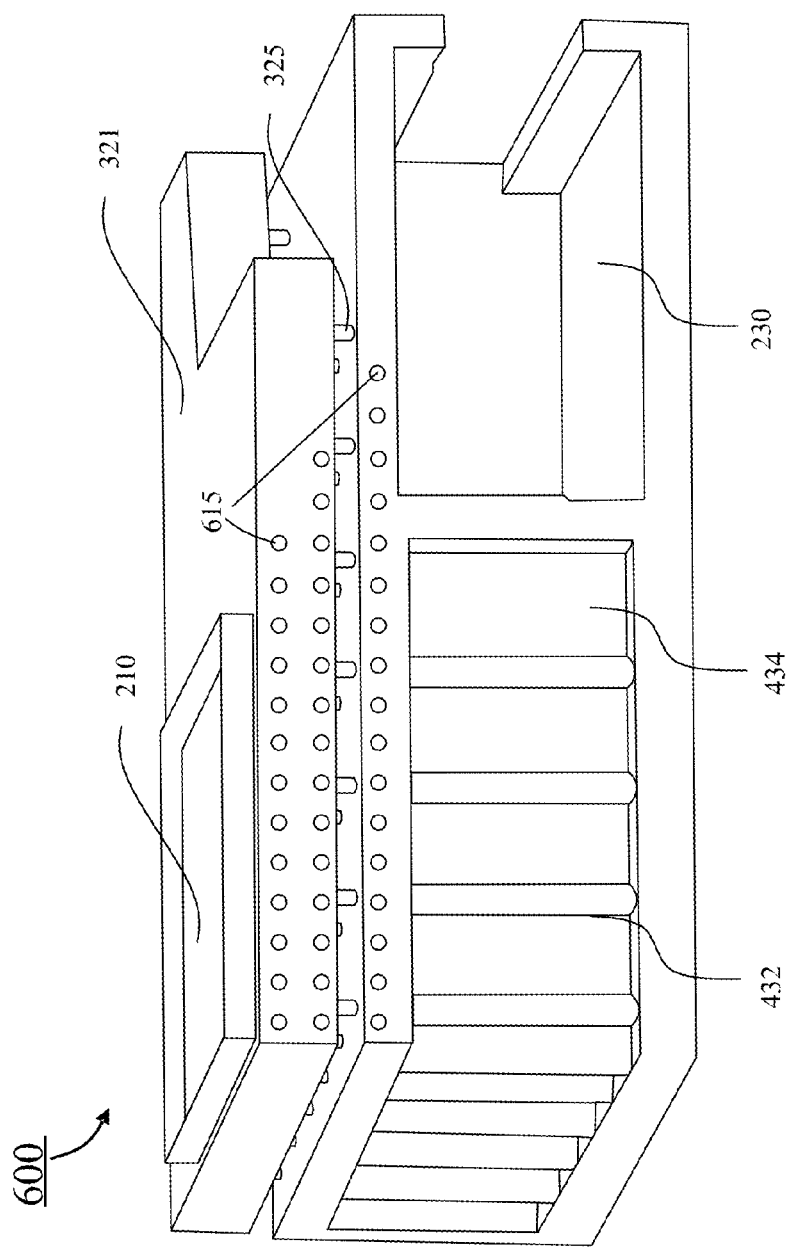
FIG. 6 schematically depicts an isometric view of a section of a support structure, according to an embodiment of the present invention, showing effects of thermal stress.

FIG. 6 depicts an isometric view of a section 600 of a support structure 300 (e.g., a quarter of the entire structure), according to an embodiment of the present invention. In the following FIGS. 7 and 8, deformations (greatly exaggerated) produced due to temperature differences between object 210, chuck 321, and/or stage 230 are shown. The structure shown in FIG. 6 is similar to the structure 300 shown in FIG. 3. The additional objects 350 and 360 are not shown in FIG. 6. However, a cross section view of optional cooling channels 615 are shown through both chuck 321 and stage 230. Cooling channels 615 help in maintaining a target temperature in portions of the support structure. Baffles 434 and 432 running along x and y directions, respectively, are also shown in FIG. 6.

Figure 7:
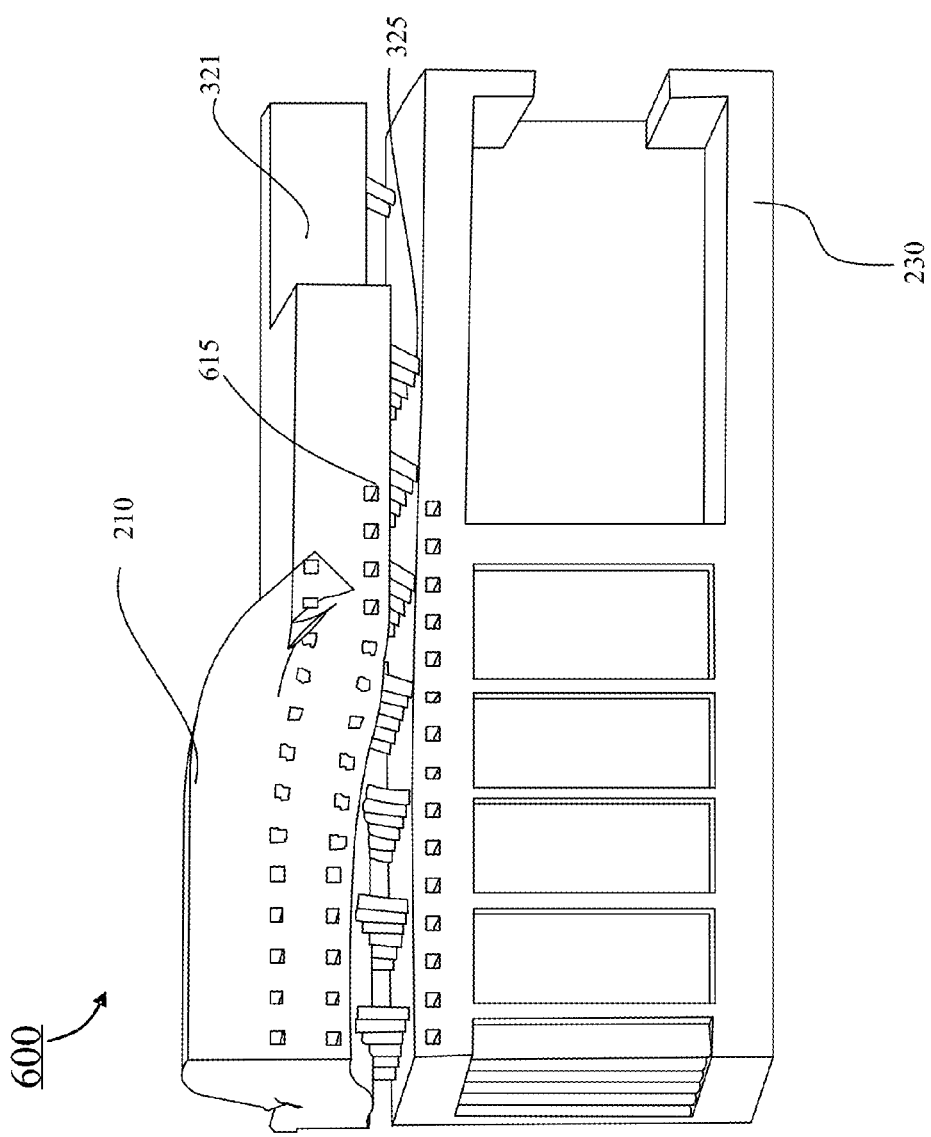
FIG. 7 schematically depicts deformations of the chuck, the supported object, and the elongated elements of the shear layer shown in FIG. 6, when there is no temperature gradient in the stage, according to an embodiment of the present invention.
Figure 8:
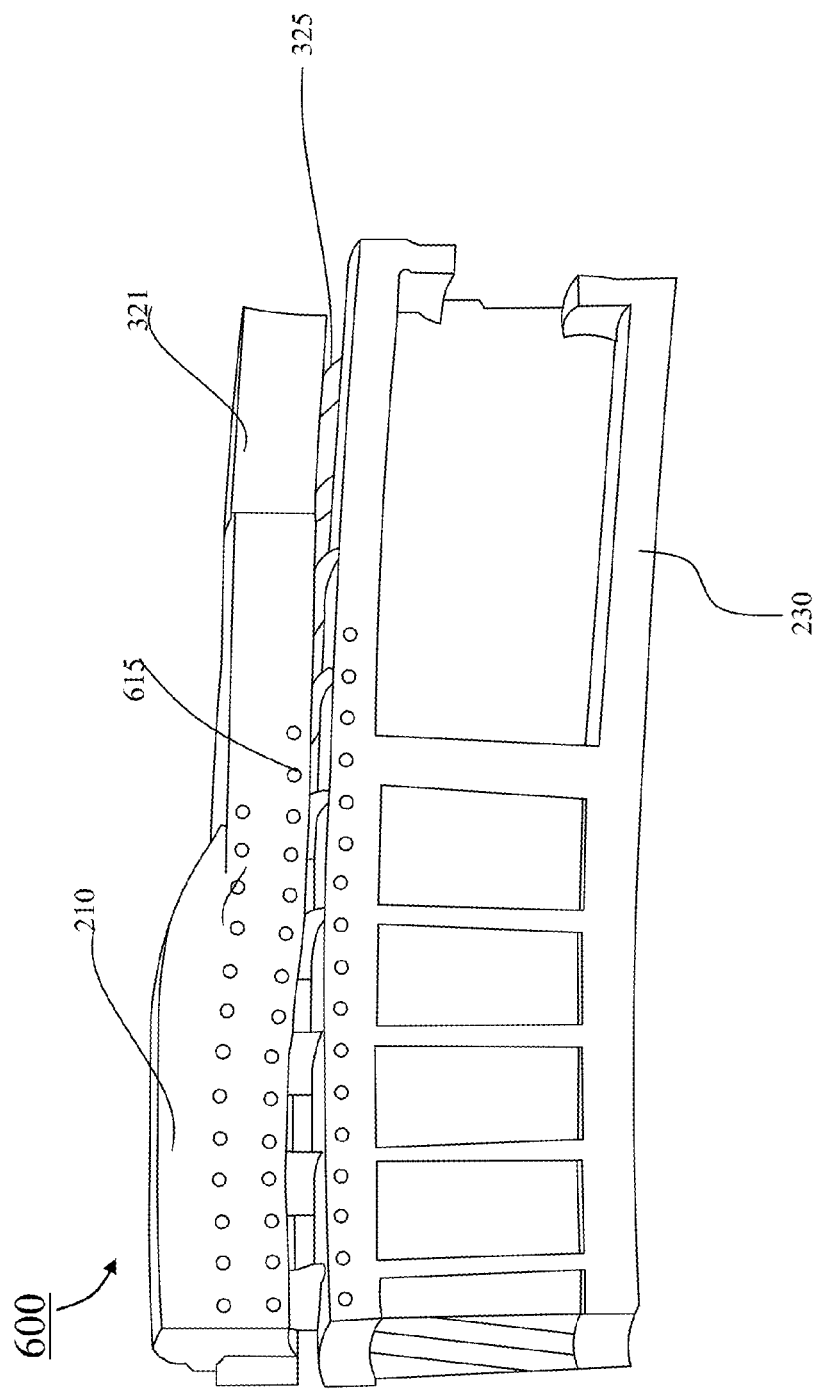
FIG. 8 schematically depicts deformations of the chuck, the supported object, the stage, and the elongated elements of the shear layer shown in FIG. 6, when there is an example temperature gradient in the stage, according to an embodiment of the present invention.

FIG. 7-8 show the deformations (exaggerated for illustrative purposes) of object 210, chuck 321, and elongated elements 325, when support structure 300 of FIG. 6 is under a thermal stress due to relative temperature differences. In this example, stage 230 may comprise SiSiC. FIG. 7 shows a condition where there is no thermal gradient in stage 230. This simulation shows a thermal overlay of about 1.7 nm.

FIG. 8 shows the deformations (exaggerated for illustrative purposes) of object 210, chuck 321, and elongated elements 325 when a thermal gradient of about 0.05 K is assumed in the SiSiC stage 230. Stage 230 itself is deformed in this situation. Thermal overlay is slightly improved in this situation.

Shear-Layer Pin Configurations

FIGS. 9A and 9B show two different configurations of elongated elements 325, e.g., 325A and 325B, respectively, of a shear layer, according to various embodiments of the present invention. In both the embodiments, an epoxy layer 980 is used to couple chuck 321 with stage 230 through elongated elements 325. In FIG. 9A, a pin configuration 325A is shown, which has a flat first end 990 coupled to chuck 321, and a second end 985 coupled to stage 230, for example in a close-fit hole 986 of stage 230 that may be filled with epoxy. In FIG. 9B, a pin configuration 325B is shown, which has a first end 992 coupled to chuck 321 in a loose-fit hole 993 of chuck 321, which may be filled with epoxy, and a second end 985 coupled to stage 230 in a close-fit hole 986 of stage 230, which also may filled with epoxy.

As will be appreciated by persons skilled in the art, various other configurations of the pins or elongated elements 325 may be used too without departing from the scope of the invention. For example, brazing the pins to the chuck and/or the stage, using fasteners (e.g., threaded joints), machining the pins or other shaped structures directly into the chuck and/or the stage, etc. are all viable alternative embodiments of the present invention.

Alternative Embodiment of Object Support Structure with Interface Membrane

Figure 10A:
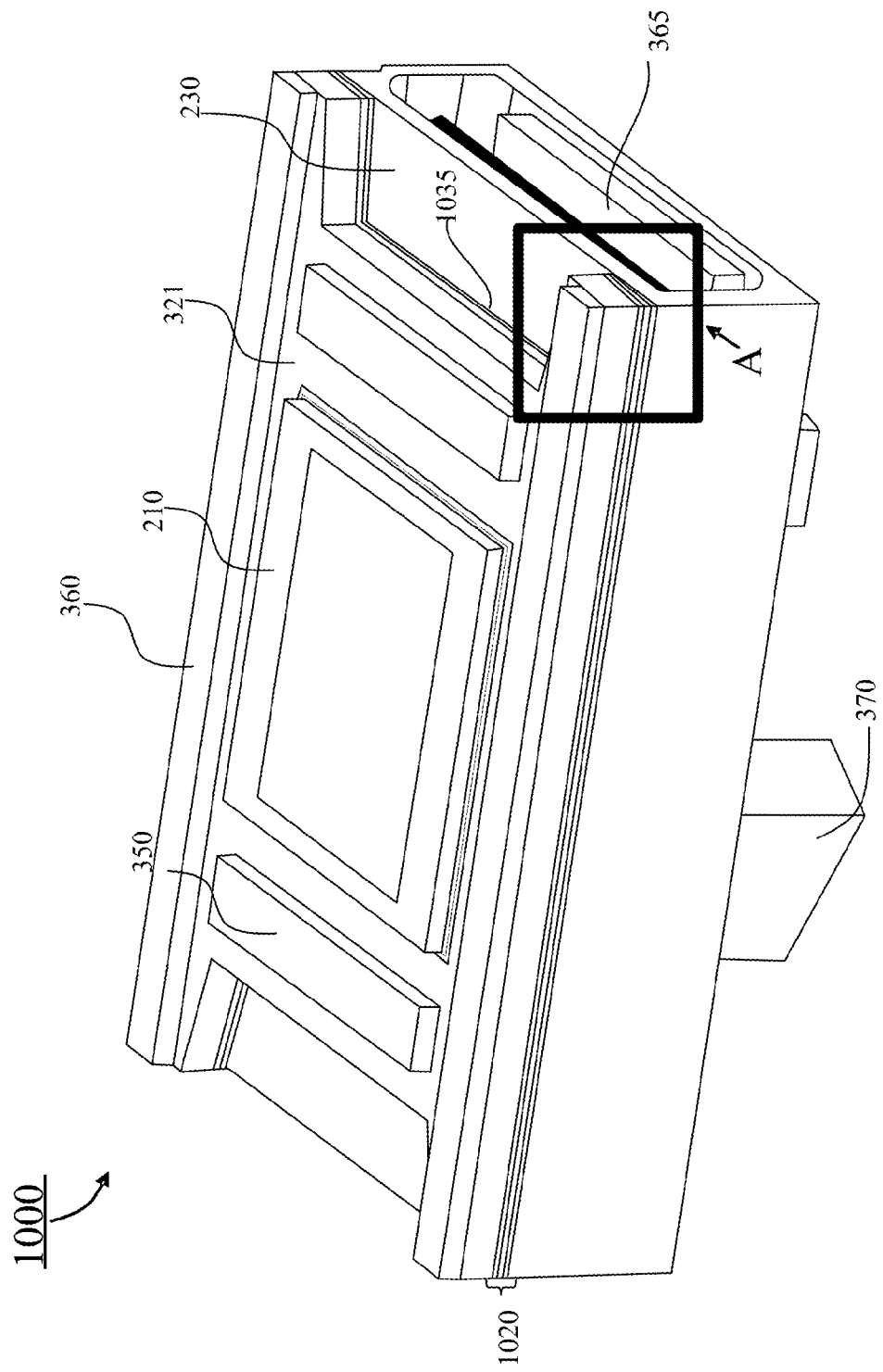

FIGS. 10A-10C show an alternative embodiment 1000 of the support structure 300, employing a shear-layer 1020, wherein an interface membrane layer 1035 (see FIG. 10B) is disposed between a chuck 321 and a stage 230. FIG. 10A shows an isometric view of support structure 1000, a portion of which (enclosed within the bounding square A) is shown with greater magnification in FIG. 10B. In FIG. 10B, interface membrane layer 1035 is clearly seen. Interface membrane layer 1035 may have pin patterns machined into it, through which elongated elements 325 pass. Interface membrane layer 1035 and elongated elements 325 may be made integral to each other out of the same material, e.g., Invar, SiSiC etc. Thickness of interface membrane layer 1035 is designed so that shear-layer 1020 can provide a desired shear compliance. FIG. 10C shows a further magnified side view of a portion of support structure 1000 in square A in FIG. 10A, showing details of shear-layer 1020.

Methods for Measuring Object Slippage under Stress

FIGS. 11 and 12 schematically illustrate flowcharts of methods 1100 and 1200, respectively, according to embodiments of the present invention. Method 1100 relates to acceleration-induced stress in the support structure, and method 1200 relates to thermal stress in the support structure. In one example, methods 1100 and 1200 can be practiced by one or more of the systems discussed above.

In block 1110, a chuck and a stage are coupled through a shear layer including elongated elements.

In block 1115, a patterning device or a substrate is supported on the chuck.

In block 1120, an acceleration is imparted to the stage. As a result, the stage, the elongated elements and the chuck are deformed.

In block 1125, deformations of the chuck are measured.

In block 1130, measured deformations of the chuck is correlated with a slippage of the patterning device or the substrate on the chuck.

In FIG. 12, blocks 1210, 1215, 1225, and 1230 of method 1200 are substantially identical to blocks 1110, 1115, 1125, and 1130, respectively, of method 1100. However, in block 1220, thermal stress is induced in the support structure due to temperature difference between the stage, the chuck, and the patterning device or substrate.

Additionally, or alternatively, in other embodiments a method may be used when a stress is produced by a combination of acceleration and temperature difference.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

The invention claimed is:

1. A system for supporting an object, comprising:
a chuck having a first surface that supports the object;
a stage that supports the chuck in one or more directions of translation or rotation; and
an interface layer comprising an array of elongated elements extending from a surface of the interface layer, the interface layer being disposed between the chuck and the stage with a relatively low stiffness in at least one direction of translation or rotation with respect to the other directions of translation or rotation, resulting in minimization of slippage of the object relative to the first surface of the chuck during deformation of the chuck due to a stress between the stage and the chuck.

2. The system of claim 1, wherein the stress arises from acceleration of the stage.

3. The system of claim 1, wherein the stress arises due to a relative temperature difference between the object, the chuck, and the stage.

4. The system of claim 1, wherein at least one of an acceleration of the stage and a relative temperature difference between the object, the chuck, and the stage is configured to produce the stress.

5. The system of claim 1, wherein the array of elongated elements are arranged to distribute the stress uniformly.

6. The system of claim 1, wherein the array of elongated elements extend orthogonally from the surface of the interface layer.

7. A lithographic apparatus, comprising:
an illumination system configured to condition a radiation beam;
a support configured to support a patterning device, the patterning device being configured to impart the radiation beam with a pattern in its cross-section to form a patterned radiation beam;
a projection system configured to project the patterned radiation beam onto a target portion of a substrate; and
a substrate table configured to support the substrate,
wherein at least one of the support and the substrate table includes:
a chuck having a first surface that supports the patterning device or the substrate,
a stage that supports the chuck in one or more directions of translation or rotation, and
an interface layer comprising an array of elongated elements extending from a surface of the interface layer, the interface layer being disposed between the chuck and the stage with a relatively low stiffness in at least one direction of translation or rotation with respect to the other directions of translation or rotation, resulting in minimization of slippage of the patterning device or the substrate relative to the first surface of the chuck during deformation of the chuck due to a stress between the stage and the chuck.

8. The lithographic apparatus of claim 7, wherein the stress arises from acceleration of the stage.

9. The lithographic apparatus of claim 7, wherein the stress arises due to a relative temperature difference between the patterning device or the substrate, the chuck, and the stage.

10. The lithographic apparatus of claim 7, wherein at one of an acceleration of the stage and a relative temperature difference between the patterning device or the substrate, the chuck, and the stage is configured to produce the stress.

11. The lithographic apparatus of claim 7, wherein the array of elongated elements are arranged to distribute the stress uniformly.

12. The lithographic apparatus of claim 7, wherein the array of elongated elements extend orthogonally from the surface of the interface layer.

\* \* \* \* \*

UNITED STATES PATENT AND TRADEMARK OFFICE
CERTIFICATE OF CORRECTION

| | | |
|---|---|---|
| PATENT NO. | : 8,976,336 B2 | Page 1 of 1 |
| APPLICATION NO. | : 14/259723 | |
| DATED | : March 10, 2015 | |
| INVENTOR(S) | : Nayfeh et al. | |

It is certified that error appears in the above-identified patent and that said Letters Patent is hereby corrected as shown below:

Title Page, Item (56), under "OTHER PUBLICATIONS" please delete "Searcg" and insert --Search--.

Claims

In Col 12, line 64, Claim 10, after "wherein at", please add --least--.

Signed and Sealed this
Third Day of November, 2015

Michelle K. Lee
*Director of the United States Patent and Trademark Office*